(12) United States Patent
Shufflebotham et al.

(10) Patent No.: US 9,303,316 B1
(45) Date of Patent: Apr. 5, 2016

(54) CONTINUOUS WEB APPARATUS AND METHOD USING AN AIR TO VACUUM SEAL AND ACCUMULATOR

(75) Inventors: Paul Shufflebotham, San Jose, CA (US); Robert Martinson, Palo Alto, CA (US); Heinrich von Bunau, San Jose, CA (US); Kevin Lynch, Santa Clara, CA (US); Mathew Sheffield, San Ramon, CA (US)

(73) Assignee: APOLLO PRECISION KUNMING YUANHONG LIMITED, Kunming (CN)

( * ) Notice: Subject to any disclaimer, the term of this patent is extended or adjusted under 35 U.S.C. 154(b) by 920 days.

(21) Appl. No.: 13/006,098

(22) Filed: Jan. 13, 2011

Related U.S. Application Data

(60) Provisional application No. 61/282,297, filed on Jan. 15, 2010.

(51) Int. Cl.
| | | |
|---|---|---|
| *B05C 11/00* | (2006.01) | |
| *F26B 25/00* | (2006.01) | |
| *C23C 14/56* | (2006.01) | |
| *B05C 15/00* | (2006.01) | |

(52) U.S. Cl.
CPC ............. *C23C 14/566* (2013.01); *C23C 14/562* (2013.01); *C23C 14/568* (2013.01); *F26B 25/008* (2013.01); *B05C 15/00* (2013.01); *Y10S 438/907* (2013.01)

(58) Field of Classification Search
CPC .... C23C 16/4401; C23C 2/38; C23C 14/568; C23C 16/545; H01L 21/67216; H01L 21/67706; H01L 31/18; H01L 31/206; B21B 9/00; B65H 19/1852; B32B 17/10853; G03G 15/2003; F26B 25/008

USPC ............... 118/733, 718, 719, 65, 634, 70; 156/504; 34/242; 277/906
See application file for complete search history.

(56) References Cited

U.S. PATENT DOCUMENTS

| | | | | |
|---|---|---|---|---|
| 2,384,500 | A * | 9/1945 | Stoll | C23C 14/04 118/718 |
| 2,654,587 | A * | 10/1953 | Skivesen | C21D 9/565 164/475 |
| 2,742,273 | A * | 4/1956 | Skivesen | C21D 9/0006 34/242 |
| 2,844,889 | A * | 7/1958 | Corbett | D06B 23/18 34/242 |
| 3,024,157 | A * | 3/1962 | Beerli | 156/504 |
| 3,306,594 | A * | 2/1967 | Bauer | D06B 23/16 34/242 |
| 3,547,683 | A * | 12/1970 | Hayes | B05D 1/60 427/255.5 |
| 3,602,191 | A * | 8/1971 | Gorton, Jr. | H01F 41/0679 118/33 |
| 3,651,671 | A * | 3/1972 | Sando | D06B 17/00 34/242 |
| 4,262,855 | A * | 4/1981 | Haag | 242/552 |
| 4,460,430 | A * | 7/1984 | Kissell et al. | 156/504 |
| 4,519,339 | A * | 5/1985 | Izu et al. | 118/718 |
| 4,763,601 | A * | 8/1988 | Saida et al. | 118/718 |
| 4,842,681 | A * | 6/1989 | Bader et al. | 156/504 |
| 4,986,888 | A * | 1/1991 | Hosten et al. | 204/198 |
| 5,088,908 | A * | 2/1992 | Ezaki et al. | 425/73 |
| 5,252,170 | A * | 10/1993 | Schaupp | 156/350 |

(Continued)

*Primary Examiner* — Karl Kurple
(74) *Attorney, Agent, or Firm* — The Marbury Law Group PLLC

(57) ABSTRACT

A deposition apparatus includes an input spool located in non-vacuum input module, at least one vacuum process module, an accumulator, and an air to vacuum sealing mechanism. The accumulator and the sealing mechanism are configured to continuously provide a web substrate from the input spool at atmosphere into the at least one process module at vacuum without stopping the web substrate.

13 Claims, 5 Drawing Sheets

(56) References Cited

U.S. PATENT DOCUMENTS

| | | | |
|---|---|---|---|
| 5,266,116 A * | 11/1993 | Fujioka et al. | 118/718 |
| 5,527,389 A * | 6/1996 | Rosenblum et al. | 118/58 |
| 5,571,749 A * | 11/1996 | Matsuda et al. | 438/484 |
| 5,951,835 A | 9/1999 | Namiki et al. | |
| 6,153,064 A * | 11/2000 | Condra et al. | 204/198 |
| 6,874,344 B1 * | 4/2005 | Junius et al. | 72/38 |
| 6,878,207 B2 * | 4/2005 | Doehler et al. | 118/718 |
| 6,974,976 B2 * | 12/2005 | Hollars | 257/184 |
| 7,121,063 B2 * | 10/2006 | Haws | 53/412 |
| 7,128,795 B2 * | 10/2006 | Byrne et al. | 156/159 |
| 7,384,497 B2 * | 6/2008 | Christensen et al. | 156/285 |
| 7,410,542 B2 * | 8/2008 | Nolan et al. | 118/718 |
| 7,426,809 B2 * | 9/2008 | Arima | 53/64 |
| 7,449,089 B2 * | 11/2008 | Hubel | 204/198 |
| 7,544,884 B2 * | 6/2009 | Hollars | 136/256 |
| 8,048,707 B1 * | 11/2011 | Shufflebotham et al. | 438/62 |
| 8,202,366 B2 * | 6/2012 | Dickey et al. | 118/718 |
| 8,465,589 B1 * | 6/2013 | Nath et al. | 118/715 |
| 2004/0159285 A1 * | 8/2004 | Doehler et al. | 118/718 |
| 2005/0284564 A1 * | 12/2005 | Horsfield et al. | 156/199 |
| 2005/0287321 A1 * | 12/2005 | Horsfield et al. | 428/34.2 |
| 2007/0069428 A1 * | 3/2007 | Pfaff et al. | 264/442 |
| 2007/0126966 A1 * | 6/2007 | Takahashi | 349/130 |
| 2007/0151685 A1 * | 7/2007 | Horsfield et al. | 162/125 |
| 2007/0169695 A1 * | 7/2007 | Schneiders et al. | 118/718 |
| 2007/0237894 A1 * | 10/2007 | Powell | 427/248.1 |
| 2007/0237984 A1 * | 10/2007 | Matsuura et al. | 428/690 |
| 2008/0236733 A1 * | 10/2008 | Hudetz | 156/252 |
| 2009/0154969 A1 * | 6/2009 | Biegelsen et al. | 399/335 |
| 2010/0226629 A1 * | 9/2010 | Basol et al. | 392/407 |
| 2012/0031604 A1 * | 2/2012 | Sferlazzo et al. | 165/185 |
| 2013/0122316 A1 * | 5/2013 | Brabbs et al. | 428/461 |

* cited by examiner

CONTINUOUS WEB APPARATUS AND METHOD USING AN AIR TO VACUUM SEAL AND ACCUMULATOR

CROSS REFERENCE TO RELATED PATENT APPLICATION

This application claims the benefit of U.S. Provisional Application No. 61/282,297, filed Jan. 15, 2010, incorporated herein by reference in its entirety.

BACKGROUND

The present invention is directed generally to a vacuum deposition apparatus and method, and specifically to an apparatus and method which includes an air to vacuum seal and an accumulator.

Interest in thin-film photovoltaics has expanded in recent years. This is due primarily to improvements in conversion efficiency of cells made at the laboratory scale, and the anticipation that manufacturing costs can be significantly reduced compared to the older and more expensive crystalline and polycrystalline silicon technology. The term "thin-film" is used to distinguish this type of solar cell from the more common silicon based cell, which uses a relatively thick silicon wafer.

Thin-film solar cells may be manufactured using a roll-to-roll coating system based on sputtering, evaporation or chemical vapor deposition (CVD) techniques. A thin foil substrate, such as a foil web substrate, is fed from a roll in a linear belt-like fashion through the series of individual vacuum chambers or a single divided vacuum chamber where it receives the required layers to form the thin-film solar cells.

Since the deposition process takes place in a vacuum, the foil roll may have to be either be placed inside a vacuum chamber itself, thus complicating the process and apparatus, or providing the foil web into a sealed passage, stopping the foil web, pumping down the passage, and then restarting the foil web by passing it from the pumped down passage into and out of the vacuum chamber(s) in which the various layers are deposited onto the foil.

In such a system, the foil is supplied on a roll and has a finite length. To provide a continuously fed foil layer, the end of a new roll must be coupled to the end of the previous roll. This involves stopping the original web foil, attaching the new web foil leading end to the tail end of the original web foil and then feeding the new web foil into the coating apparatus.

SUMMARY

One embodiment of the invention relates to a deposition apparatus which comprises an input spool located in non-vacuum input module, at least one vacuum process module, an accumulator, and an air to vacuum sealing mechanism. The accumulator and the sealing mechanism are configured to continuously provide a web substrate from the input spool at atmosphere into the at least one process module at vacuum without stopping the web substrate.

It is to be understood that both the foregoing general description and the following detailed description are exemplary and explanatory only, and are not restrictive of the embodiments as claimed.

BRIEF DESCRIPTION OF THE DRAWINGS

These and other features, aspects, and advantages of the present embodiments will become apparent from the following description, appended claims, and the accompanying exemplary embodiments shown in the drawings, which are briefly described below.

DETAILED DESCRIPTION

It should be noted that, as used herein, the terms "over" and "on" both inclusively include "directly on" (no intermediate materials, elements or space disposed therebetween) and "indirectly on" (intermediate materials, elements or space disposed therebetween). For example, forming an element "on a substrate" can include forming the element directly on the substrate with no intermediate materials/elements therebetween, as well as forming the element indirectly on the substrate with one or more intermediate materials/elements therebetween.

Figure 1:
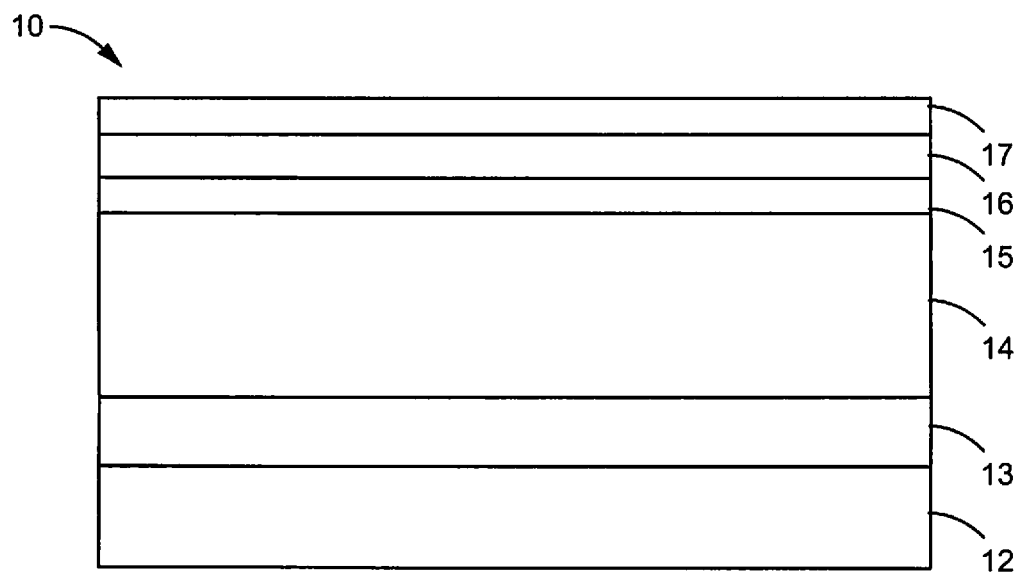
FIG. 1 is a schematic side cross section of a thin-film solar cell according to an exemplary embodiment.

The embodiments of the present invention provide web foil substrate layer which continuously moves through one or more vacuum deposition chambers (referred to as process chambers) at a relatively constant rate without stopping while the web is fed from air into the process chambers under vacuum and while the web from one roll is spliced to the web from another roll. Referring to FIG. 1, a cross-section of a thin-film solar cell 10 is shown according to an exemplary embodiment. Because of the large range in the thickness of the different layers, they are depicted schematically and are not necessarily to scale. The cell 10 is intended to be positioned such that the direction of the solar illumination is incident on the cell from the top. Layer 12 is the substrate. According to an exemplary embodiment, the substrate is metallic foil, such as stainless steel, Al or Ti. Alternatively, it may comprise a polymer foil. Layer 13 is the back electrical contact for the cell. The electrical contact layer may be, for example, molybdenum with a thickness of about 0.5 to 1.0 microns.

Layer 14 is a copper indium gallium diselenide (CIGS) p-type semiconductor absorber layer. It is usually about 2 to 3 microns thick, but may be thinner in other exemplary embodiments. Layer 15 is the n-type semiconductor layer that completes the formation of the p-n junction. It is preferably thinner than the absorber layer (about 0.05 to 0.1 microns), and it should be highly transparent to the solar radiation. Traditionally, it has been called the window layer, since it lets the light pass down to the absorber layer. It is also referred to as a buffer layer because it seems to help protect the p-n junction from damage induced by the deposition of the next layer, and improves the overall electrical matching between the p-type absorber and n-type top transparent electrode. The n-type buffer layer may be, for example, CdS, ZnS, ZnSe, or another sulfide or selenide.

Layer 16 is the top transparent electrode, which completes the functioning cell. This layer is both highly conductive and as transparent as possible to solar radiation. Layer 16 may be, for example, one or more transparent conductive layers, such as ZnO, indium tin oxide (ITO), Al doped ZnO ("AZO") or a combination of higher resistivity AZO and lower resistivity ZnO, ITO or AZO layers. Layer 17 is the optional antireflection (AR) coating, which can allow a significant amount of extra light into the cell. Depending on the intended use of the cell, it might be deposited directly on the top conductor (as illustrated), or on a separate cover glass, or both.

Figure 2:
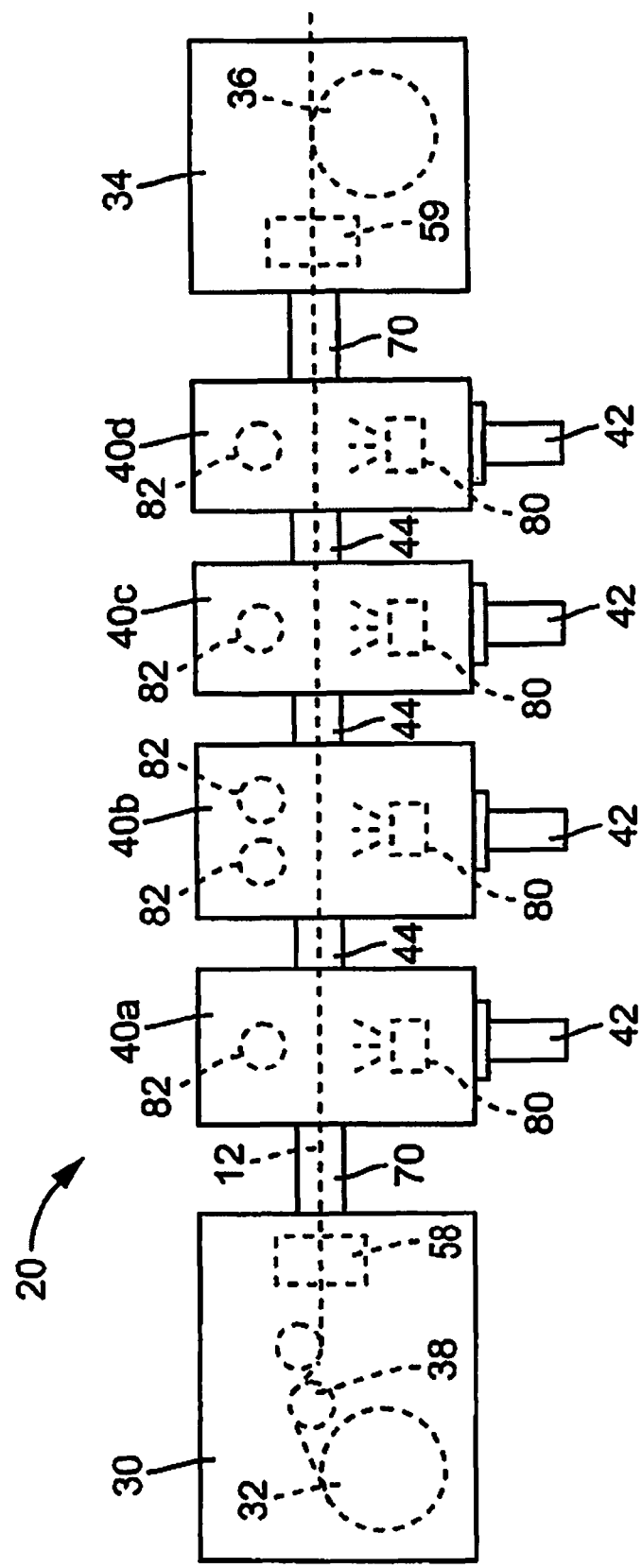
FIG. 2 is a schematic diagram of a modular sputtering apparatus that can be used to manufacture the solar cell illustrated in FIG. 1 according to an exemplary embodiment.

Referring now to FIG. 2, an apparatus 20 (e.g., assembly, machine, mechanism, etc.) for forming a thin-film solar cell 10 such as the one shown in FIG. 1 is shown according to an exemplary embodiment. The apparatus 20 includes an input module 30 (e.g., load module, etc.) and an output module 34 (e.g., unload module, etc.). Between the input module 30 and the output module 34 are process modules 40 (e.g., 40*a*-40*d*). The number of process modules 40 may be varied to match the requirements of the device that is being produced. Each module may include a pumping device 42, such as a vacuum pump (e.g., a high throughput turbomolecular pump), to provide the required vacuum and to handle the flow of process gases during the sputtering operation. Each module 40 may have a number of pumps placed at other locations selected to provide optimum pumping of process gases. The process modules 40 are connected together at slit valves 44, which contain very narrow low conductance isolation slots to prevent process gases from mixing between modules. These slots 44 may be separately pumped if required to increase the isolation even further. Other module connectors may also be used. Alternatively, a single large chamber may be internally segregated to effectively provide the module regions, if desired.

The web substrate 12, such as a metal or polymer web foil, is moved throughout the apparatus 20 by rollers 38, or other devices. Additional guide rollers may be used. Rollers 38 shown in FIG. 2 are schematic and non-limiting examples. Some rollers 38 may be bowed to spread the web, some may move to provide web steering, some may provide web tension feedback to servo controllers, and others may be mere idlers to run the web in desired positions. According to one exemplary embodiment, the substrate 12 maybe oriented in one direction in the module 30 and in a different direction in module(s) 40. For example, the substrate is oriented generally horizontally in the input module 30 and generally vertically in the process module(s) 40. A turning roller or turn bar (not shown) may be provided to change the orientation of the substrate 12, such as between the input module 30 and the process module 40. The input spool 32 and optional output spool 36 may be actively driven and controlled by feedback signals to keep the substrate 12 in constant tension throughout the machine 20. Preferably module 30 is maintained in the air ambient at all times while the process module(s) 40 are maintained at vacuum during layer deposition.

In some embodiments, the substrate 12, instead of being rolled up onto output spool 36, may be sliced into solar modules by the cutting device 59 in the output module 34. In these embodiments, the output spool 36 may be omitted. As a non-limiting example, some of the devices/steps may be omitted or replaced by any other suitable devices/steps. For example, bowed rollers and/or steering rollers may be omitted in some embodiments.

Figure 3:
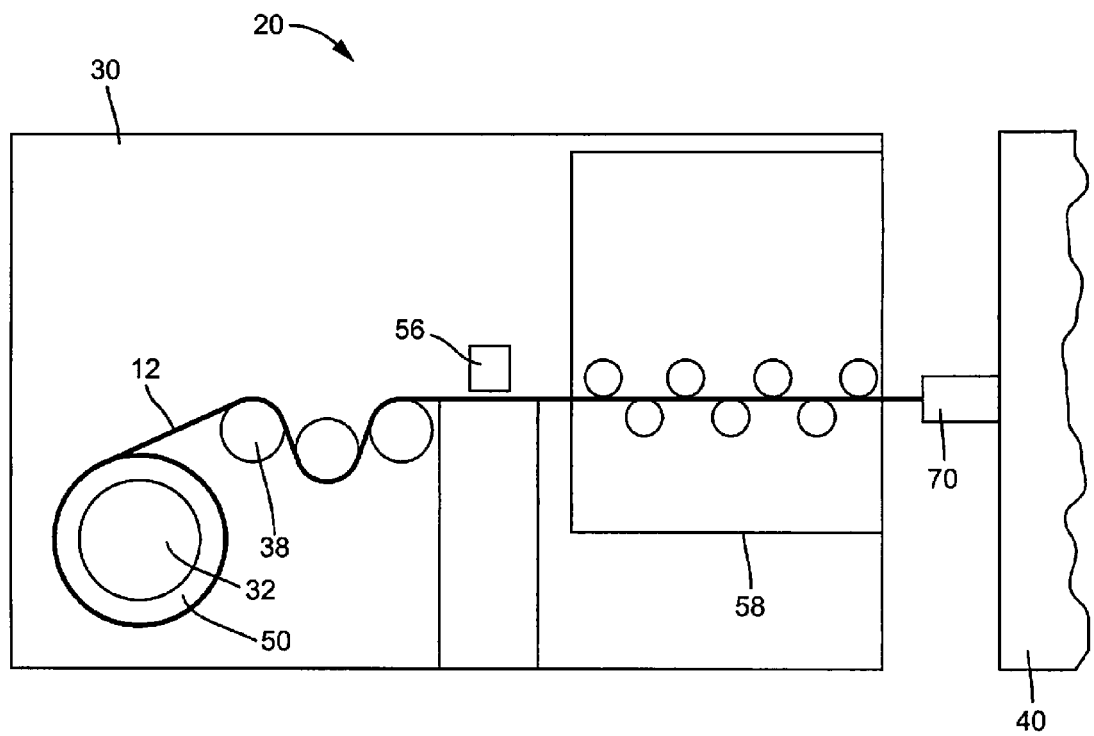
FIG. 3 is a schematic diagram of a input or load module for the sputtering apparatus of FIG. 2 including an accumulator and a welding mechanism according to an exemplary embodiment.

Referring now to FIG. 3, an input module 30 is shown that is configured to allow the continuous feeding of a web substrate 12 through the apparatus 20. As described above, the input module 30 includes an input spool 32 upon which is placed a roll 50 of a substrate material such as a stainless steel foil. The input module 30 also includes the web splicing device 56 and an accumulator 58. The web splicing region or device 56 splices leader and trailer sections of the substrate 12 to facilitate loading and unloading of the rolls 50.

Figure 4:
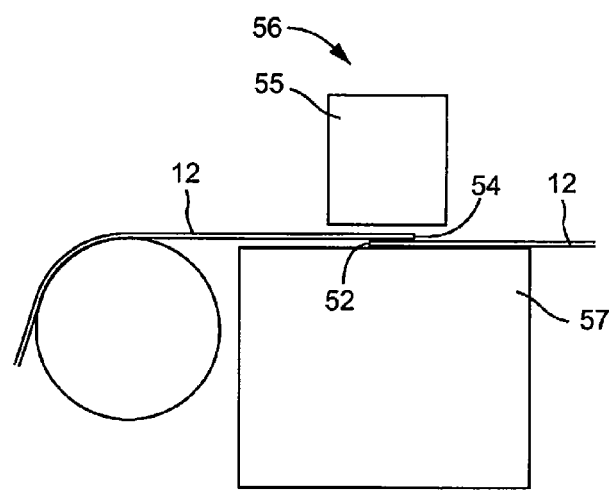
FIG. 4 is a schematic side view of the welding mechanism of FIG. 3 according to an exemplary embodiment.

The substrate 12 passes through the web splicing region or device 56 shown as a welding mechanism in FIG. 4. As a first roll 50 reaches its end in module 30, it is removed and a new, full second roll 50 is placed on the input spool 32. The removal and replacement of the rolls may be made manually or mechanically. The trailing edge or end 52 of the substrate 12 from the old first roll is overlapped with the leading edge or end 54 of the substrate 12 from the new second roll. The web splicing device 56 includes a welding head 55 and a table or platform 57. The welding head 55 moves across the platform 57 (along an axis extending out of the page of the drawing) to join the ends of two rolls of the substrate material with a weld. The platform may comprise an electrically grounded metal table, such as a steel, Al or Cu table.

Figure 5:
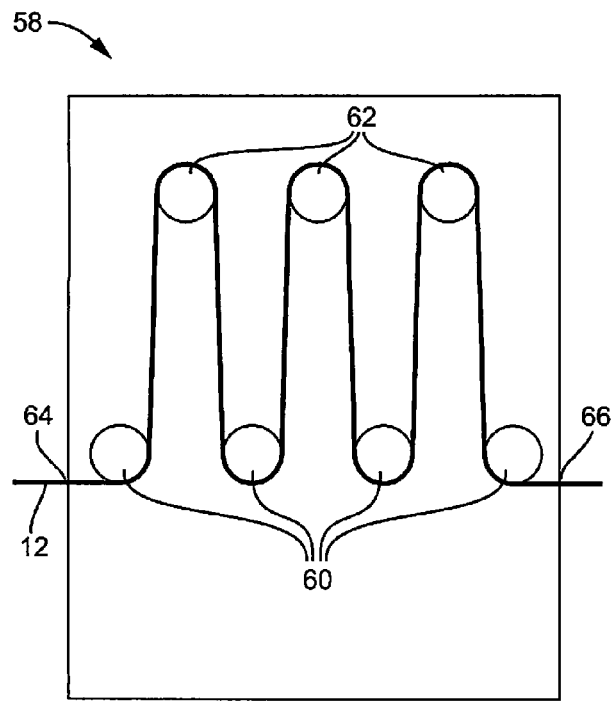
FIG. 5 is a schematic side view of the accumulator of FIG. 3 shown in a first configuration according to an exemplary embodiment.

Referring now to FIGS. 4 and 5, to avoid having to stop the apparatus 20 to join the ends of the substrates 12 in the web splicing region 56 (e.g., to continue moving the web substrate 12 through the process module(s) 40 at a relatively constant rate during the splicing), an accumulator 58 is provided to variably control the rate of movement of the trailing end of the first substrate 12. The first substrate 12 moves through the accumulator 58 from a generally fixed entrance point 64 to a generally fixed exit point 66. The accumulator 58 adjusts the velocities of the substrate at the entrance point 64 relative to the exit point 66 by adjusting the path that the substrate 12 follows through the accumulator. The accumulator 58 allows the first substrate 12 to continue to enter the process module(s) 40 at a constant rate to allow layer deposition on the substrate while at the same time allowing the trailing end 52 of the first substrate 12 to remain stationary for a period of time so that it may be coupled to the leading edge 54 of the new second substrate 12. The accumulator 58 includes a first set of rollers 60 and a second set of rollers 62 that are interspaced with the first set of rollers 60 (e.g., rollers in the second set 62 alternate with the rollers in the first set 60). The second set of rollers 62 are able to be moved relative to the first set of rollers 60. For example, rotatable rollers 60 may be movable or stationary (e.g., have an axis which moves up or down for a horizontal web substrate) while the rotatable roller 62 are movable.

In a first configuration, shown in FIG. 5, the second set of rollers 62 are moved such that they are offset from the first set of rollers 60 at a distance. According to an exemplary embodiment, the second set of rollers 62 are raised up such that they are above the first set of rollers 60. The substrate 12 is routed such that it must pass from the entrance point 64, under each of the first rollers 60 and over each of the second rollers 62 before exiting the accumulator 58 at the exit point 66. As the second rollers 62 are moved to be above the first rollers 60, the substrate 12 must follow a relatively long path from the entrance point 64 to the exit point 66. Alternatively, rollers 60 are lowered with respect to rollers 62 or rollers 60 are lowered while rollers 62 are raised for a horizontal substrate 12. For a vertical substrate, the rollers 60 and/or 62 would move in a horizontal plane.

Figure 6:
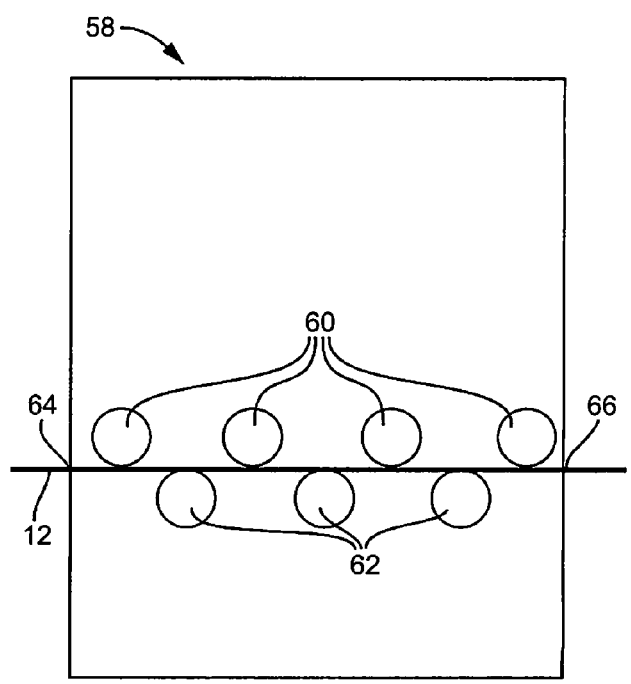
FIG. 6 is a schematic side view of the accumulator of FIG. 3 shown in a second configuration according to an exemplary embodiment.

In a second configuration, shown in FIG. 6, the second set of rollers 62 are moved such that they are proximate to the first set of rollers 60 and are offset from rollers 62 a distance less than the distance in the first configuration. According to an exemplary embodiment, the second set of rollers 62 is lowered such that they are below the first set of rollers 60. In the second configuration, the substrate 12 is routed from the entrance point 64 to the exit point 66 along a relatively shorter path (e.g., a relatively straight path) than in the first configuration. Interactions with the first set of rollers 60 and the second set of rollers 62 cause a minimal redirection between the entrance point 64 and the exit point 66 compared to the first configuration.

The substrate 12 is configured to move through the apparatus 20, and especially through the process module 40, at a relatively fixed rate of length per unit time before, during and after roll splicing. During normal operation, the accumulator 58 is preferably in the second configuration shown in FIG. 6. When it is time to change rolls 50 on the input spool 32, the accumulator 58 is then changed from the second configuration to the first configuration shown in FIG. 5. Thus, the rollers 62 are raised, such as by 1-3 meters, for example 1.5 to 2 meters, causing the trailing end of the first roll substrate to follow the longer path through the accumulator 58. The rollers 62 are then slowly lowered to feed the trailing end of the first roll substrate into the process module(s) 40 at a relatively constant rate. While the rollers 62 are being lowered, the trailing end of the first roll substrate is removed from the first roll, the first roll is removed from the spool 32, a new second roll substrate is mounted on the spool and the leading end of the second roll substrate is welded to the trailing end of the first roll substrate by the welding head 55. The rollers 62 are lowered into the second configuration shown in FIG. 6 and the second roll substrate leading end is welded to the trailing end of the first roll substrate. The second roll substrate follows the first roll substrate into module(s) 40 without stopping the substrate 12 or without changing the rate of the substrate 12 passing through the module(s) or chamber(s) 40.

Thus, as discussed above, there is a difference in length of the substrate 12 inside the accumulator 58 between the first configuration and the second configuration. The movement of the second set of rollers 62 relative to the first set of rollers 60 may be set such that the rate at which the excess length of substrate 12 between the first configuration and the second configuration is removed from the accumulator 58 is similar to the rate at which the substrate 12 passes through the process module(s) 40. In this way, while the excess length of the substrate 12 inside the accumulator 58 then passes through the exit point 66, the trailing edge 52 of the substrate 12 remains stationary. The trailing edge 52 of the substrate 12 is stationary long enough for the leading edge 54 of the new substrate 12 to be overlapped with the trailing edge 52 and the two substrate lengths to be joined at the web splicing device 56 with a welding operation. Thus, the substrate passes through the module(s) 40 during layer 13, 14, 15, 16 and/or 17 deposition in module(s) 40 without stopping or changing the substrate movement speed or rate during the roll change and slicing. The welding apparatus 56 is configured to weld a trailing edge 52 of a web substrate 12 from a first roll 50 being removed from the input spool 32 to a leading edge 54 of the web substrate 12 from a second roll 50 being mounted on the input spool. The accumulator 58 is configured to continuously provide the web substrate 12 from the welding apparatus 56 into the at least one process module 40 without stopping the web substrate during welding of the trailing edge of the web substrate from the first roll being removed from the input spool to the leading edge of the web substrate from the second roll being mounted on the input spool. The accumulator 58 increases a path length of the trailing edge 52 of the web substrate 12 from the first roll 50 prior to the step of removing this first roll 50 from spool 32. The accumulator 58 then gradually decreases the path length of the trailing edge 52 of the web substrate during the steps of removing the first roll 50, mounting the second roll 50 and attaching the leading 54 and trailing edges 52 of these two rolls, such that the trailing edge of the web substrate moves through the at least one process module 40 at about the same rate or speed during the steps of removing, mounting and attaching.

In another embodiment, the input module 30 and the output module 34 may be exposed to atmospheric pressures (i.e., comprise non-vacuum modules), while the process module(s) 40 generally require a substantial vacuum (e.g., module(s) 40 are vacuum chambers). Because the substrate 12 must pass from the input module 30 into the process module(s) 40 and the coated thin-film solar cell must pass out of the process module(s) 40 to the output module 34, an air to vacuum seal is provided at the entrance and exit of the first and last process modules 40a and 40d, respectively.

Figure 7:
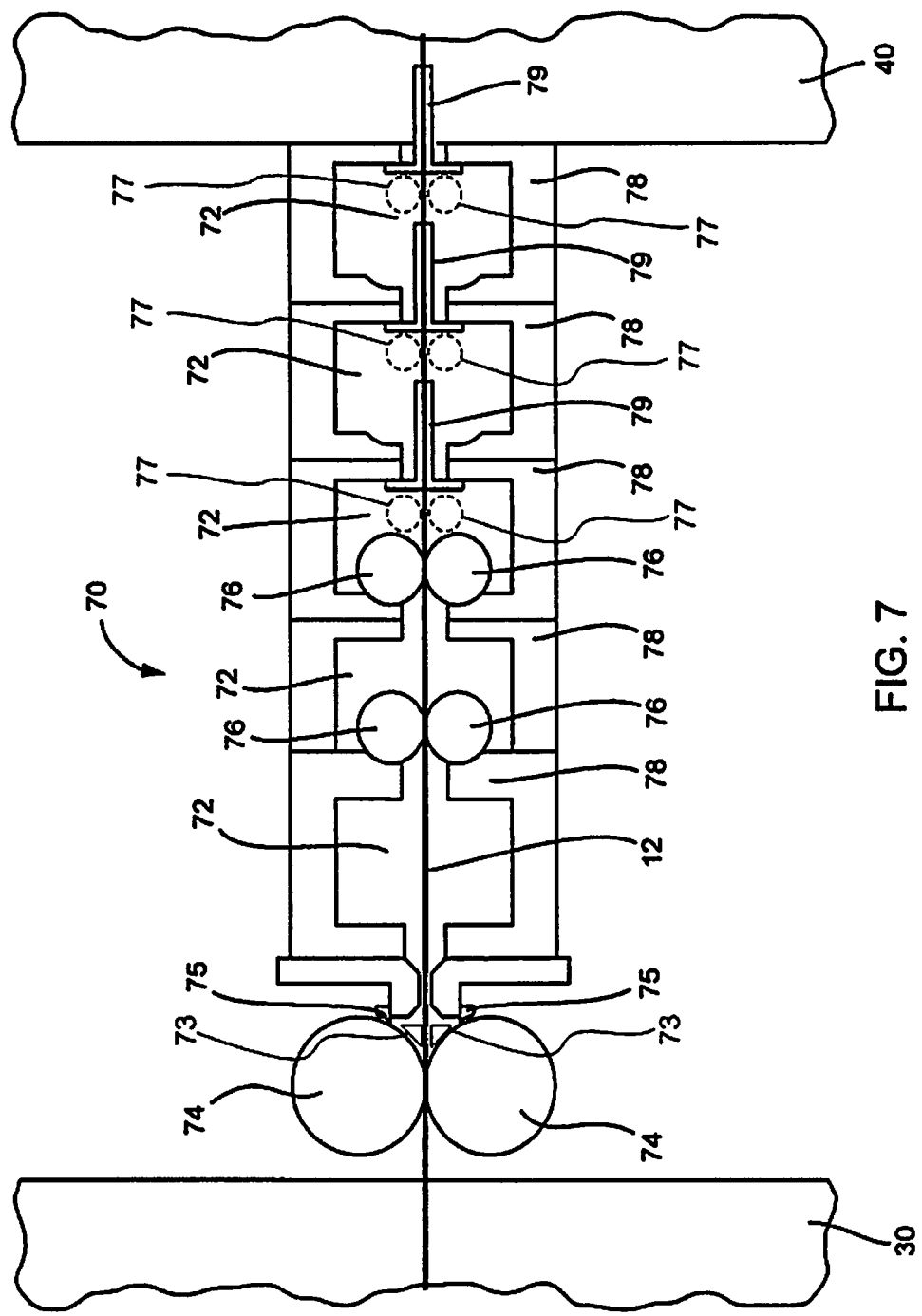
FIG. 7 is a schematic diagram of a sealing mechanism for the apparatus of FIG. 1 according to an exemplary embodiment.

Referring now to FIG. 7, a sealing mechanism 70 having a housing 71 is shown according to an exemplary embodiment. The sealing mechanism 70 is configured to allow the substrate 12 to pass into and out of the process module 40 while impeding the passage of gasses such as atmospheric gasses or processing gasses into or out of the process module 40. The sealing mechanism 70 includes multiple chambers 72. The staged chambers 72 are configured to maintain internal pressures that graduate from atmospheric on a first side of the sealing mechanism 70 (e.g., the input module 30 side) to a high vacuum on the second side of the sealing mechanism 70 opposite of the first side (e.g., the process module 40 side). Multiple chambers 72 assures that the pressure difference at any sealing surface is generally less than the pressure difference between atmospheric pressure and the high vacuum inside the process module. While the sealing mechanism 70 shown in FIG. 7 is shown as a sealing mechanism between the input module 30 and the entrance of the first process module 40 (e.g., 40a), a similar mechanism may be provided between the exit of the last process module 40 (e.g., 40d) and the output module 34. The output mechanism 70 may be the same as the input mechanism 70, but reversed 180 degrees (i.e., the limiters 79 are adjacent to module 40d and the roller seals 74 are adjacent to module 34).

The substrate 12 enters the sealing mechanism 70 between two external nip rollers 74. In one example, the input spool 32 is positioned with its axis horizontally and the nip rollers are positioned with their axis vertically. The turn bar located between the accumulator 58 and the sealing mechanism 70 is configured to turn the web substrate 12 from an initial horizontal orientation on the input spool 32, in the welding apparatus 56 and in the accumulator 58 to a vertical orientation in the sealing mechanism 70 and the process module(s) 40. Another turn bar may be added to turn the vertical web substrate coming out from the process module(s) 40 in a horizontal direction to be cut by device 59. The external rollers 74 form a rolling seal that doesn't scratch the substrate 12 as it passes into the sealing mechanism 70. The external rollers 74 form a barrier between the outside atmosphere and the first chamber 72, with the first chamber 72 having a pressure that is less than the atmospheric pressure. Potential passages for gasses between the outside atmosphere and the first chamber 72 are present between the surfaces of two external rollers 74 and between the surface of the external rollers 74 and the housing of the sealing mechanism. The passage between the two external rollers 74 is generally closed off by rolling seals between the external rollers 74 and the substrate 12. A seal 75 such as a wiper seal is provided between each of the external rollers 74 and the housing of the sealing mechanism 70 to generally prevent gasses from passing between the external rollers 74 and the housing of the sealing mechanism 70.

Each of the chambers 72 of the sealing mechanism 70 are separated by an internal wall or divider 78. Between some internal chambers 72, a pair of internal nip rollers 76, similar in function and arrangement to that of the external rollers 74, may be provided proximate to the dividers 78. The passage between the internal rollers 76 is generally closed off by rolling seals between the internal rollers 76 and the substrate 12. The internal dividers 78 may include curved sockets or contours that are configured to receive internal rollers 76 of a similar radius of curvature. The passage of gasses from one internal chamber 72 to a neighboring, lower pressure internal chamber 72 may be reduced by a simple surface to surface contact between the internal roller 76 and the divider 78. In other embodiments, a seal such as a wiper seal similar the wiper seal for the external rollers 74 may be provided for some or all of the internal rollers 76 to further reduce the infiltration of gasses into neighboring chambers 72. The internal rollers 76 and the external rollers 74 may either be freely spinning rollers or may be powered to control the rate of passage of the substrate 12 through the sealing mechanism 70.

Between other chambers 72, the passage of gasses between neighboring chambers 72 may be limited by parallel plate conductance limiters 79. The parallel plate conductance limiters 79 are generally flat, parallel plates that are arranged parallel to the surface of the substrate 12 and are spaced apart a distance slightly larger than the thickness of the substrate 12. The parallel plate conductance limiters 79 allow the substrate to pass between the chambers 72 while limiting the passage of gasses between chambers 72.

Thus, in summary, the mechanism 70 includes a housing 71, a pair of external nip rollers 74 configured to pass a web substrate between them, a wiper seal 75 between each of the pair of the nip rollers and the housing and multiple chambers 72, such as 2-10, for example 5-7 chambers, in the housing 71. The multiple chambers 72 are configured to maintain internal pressures that graduate from atmospheric pressure on a side of the housing facing the pair of external nip rollers 74 to vacuum on an opposite side of the housing facing the process chamber(s) 40. At least one pair of internal nip rollers 76 are located in the at least one of the multiple chambers 72, and at least one conductance limiter 79 is located in at least one other of the multiple chambers 72, configured to pass the web substrate 12 between two parallel plates.

According to an exemplary embodiment, the sealing mechanism 70 may also include inert gas purge 73 at the in-feed nip. According to another exemplary embodiment, the sealing mechanism 70 may also include optional reverse crown or spreading rollers 77. The difference in pressure between neighboring chambers may deform the internal rollers 76, causing them to deflect or crown towards the chamber with a lower pressure. The reverse crown rollers 77 are placed such that they correct for vacuum-induced deflection of the in-feed nip rollers 76. Thus, other than the slight deformation corrected by the reverse crown rollers 77, the mechanism 70 is configured to pass the web substrate without bending or turning or scratching the web substrate 12.

The input module 30 may further perform pre-processing steps. According to one exemplary embodiment, after being pre-cleaned, the web substrate 12 may first pass by a heater array that is configured to provide at least enough heat to remove surface adsorbed water. Subsequently, the web can pass over a special roller configured as a cylindrical rotary magnetron. This allows the surface of electrically conducting (metallic) substrates to be continuously cleaned by DC, AC, or RF sputtering as it passes around the roller/magnetron. The sputtered web material is caught on a shield, which is periodically changed. Preferably, another roller/magnetron may be added to clean the back surface of the substrate 12. Direct sputter cleaning of a substrate 12 will cause the same electrical bias to be present on the web throughout the machine, which, depending on the particular process involved, might be undesirable in other sections of the machine. The biasing can be avoided by sputter cleaning with linear ion guns instead of magnetrons, or the cleaning could be accomplished in a separate smaller machine prior to loading into this large roll coater. Also, a corona glow discharge treatment could be performed at this position without introducing an electrical bias.

Optionally, one or more additional process modules (not shown) may be added between the input module 30 and the process module 40*a* to sputter a back side protective layer over the back side of the substrate 12 before the lower electrode 13 is deposited on the front side of the substrate. Further, one or more barrier layers may be sputtered over the front side of the substrate 12. Similarly, one or more process modules (not shown) may be added between the input module 30 and the process module 40*a* to sputter one or more adhesion layers between the metal layer 13 and the CIGS layer 14.

Referring back to FIG. 2, after passing through the sealing mechanism 70, the substrate 12 enters the process modules 40 (e.g., 40*a*-40*d*). Heater arrays 80 are placed in locations where necessary to provide web heating depending upon process requirements. These heaters 80 may be a matrix of high temperature quartz lamps laid out across the width of the web. Infrared sensors provide a feedback signal to servo the lamp power and provide uniform heating across the substrate 12. In one embodiment, as shown in FIG. 1, the heaters 80 are placed on one side of the substrate 12, and sputtering targets 82 are placed on the other side of the substrate 12. Sputtering targets 82 may be mounted on dual cylindrical rotary magnetron(s), or planar magnetron(s) sputtering sources, or RF sputtering sources.

The first electrode layer 13 may be sputtered in the process module 40*a* over the substrate 12 using one or more targets 82, such as molybdenum or molybdenum-sodium targets.

The substrate 12 then passes into the next process module 40*b*, for deposition of the at least one p-type CIGS semiconductor absorber layer 14. In one embodiment, the step of depositing the at least one p-type semiconductor absorber layer 14 includes reactively alternating current (AC) magnetron sputtering the semiconductor absorber layer from at least one pair of conductive targets 82, in a sputtering atmosphere that comprises argon gas and a selenium-containing gas. In some embodiments, the pair of two conductive targets 82 comprise the same targets. For example, each of the at least two conductive targets 82 in module 40*b* may comprise copper, indium and gallium. The selenium-containing gas may be hydrogen selenide or selenium vapor. In other embodiments, targets 82 may comprise different materials from each other. The radiation heaters 80 maintain the web at the required process temperature, for example, around 400-800° C., for example around 500-700° C., which is preferable for CIGS deposition.

In some embodiments, at least one p-type semiconductor absorber layer 14 may comprise graded CIS based material. In this embodiment, the process module further comprises at least two more pairs of targets. The first magnetron pair are used to sputter a layer of copper indium diselenide while the next two pairs of magnetrons targets sputter deposit layers with increasing amounts of gallium, thus increasing and grading the band gap. The total number of targets pairs may be varied, for example may be 2-10 pairs, such as 3-5 pairs. This will grade the band gap from about 1 eV at the bottom to about 1.3 eV near the top of the layer.

The substrate 12 may then pass into the process modules 40c and 40d, for depositing the n-type semiconductor layer 15, and the transparent top electrode 16, respectively. Any suitable type of sputtering sources may be used, for example, rotating AC magnetrons, RF magnetrons, or planar magnetrons. Extra magnetron stations (not shown), or extra process modules (not shown) could be added for sputtering the optional one or more antireflection (AR) layers or more than one TCO layers.

Finally, the substrate 12 passes into output module 34, where it is either wound onto the take up spool 36, or sliced into solar cells using a cutting apparatus 59. Thus, the method of making a solar cell includes passing the web substrate 12 from the input module 30 not under vacuum to the output module 34 not under vacuum through the accumulator 58 and at least one process module 40 under vacuum, such that the web substrate continuously extends from the input module to the output module while passing through the accumulator and the at least one process module. A first roll 50 of the web substrate 12 is removed from the input spool 32 in the input module 30. A second roll 50 of the web substrate 12 is mounted on the input spool 32. A trailing edge 52 of the web substrate from the first roll which is removed from the input spool is attached (e.g., welded in welding apparatus 56) to a leading edge 54 of the web substrate from the second roll which is mounted on the input spool. The accumulator changes the length of the path of the trailing edge 52 of the web substrate 12 from the first roll 50 during the steps of removing, mounting and attaching such that the web substrate passes through the at least one process module 40 during the steps of removing, mounting and attaching without stopping and preferably at the same rate or speed. At least one layer 13, 14, 15, 16 and/or 17 is deposited on the web substrate 12 moving through the at least one process module 40 during the steps of removing, mounting and attaching. For example, at least one different layer is deposited in each of a plurality of process modules 40. This may include forming a solar cell by sputtering a first electrode 13, a CIGS p-type absorber layer 14, an n-type semiconductor layer 15 and a transparent second electrode layer 16 over the substrate 12 in corresponding one of a plurality of independently isolated, connected process modules without breaking vacuum during the steps of removing, mounting and attaching.

While sputtering was described as the preferred method for depositing all layers onto the substrate, some layers may be deposited by MBE, CVD, evaporation, plating, etc., while, preferably, the CIS based alloy is reactively sputtered. While the apparatus and method described herein have been described with respect to an example of depositing a CIGS type solar cell on a web substrate, the present invention should not be considered so limited. The apparatus and method may be used to deposit any type of layers on any type of substrate for any type of device. It is to be understood that the present invention is not limited to the embodiment(s) and the example(s) described above and illustrated herein, but encompasses any and all variations falling within the scope of the appended claims. For example, as is apparent from the claims and specification, not all method steps need be performed in the exact order illustrated or claimed, but rather in any order that allows the proper formation of the solar cells of the present invention.

What is claimed is:

1. An apparatus comprising an air to vacuum sealing mechanism comprising:

a housing configured to contain a sub-atmospheric pressure environment; a pair of external nip rollers located outside of the housing and configured to pass a web substrate between them and to provide first sealing surfaces between atmosphere and the sub-atmospheric pressure environment; a pair of wiper seals attached to the housing and providing second sealing surfaces between atmosphere and the sub-atmospheric pressure environment between each external nip roller of the pair of external nip rollers and the housing;

multiple chambers in the housing, the multiple chambers configured to maintain respective sub-atmospheric internal pressures that graduate from atmospheric pressure on a side of the housing facing the pair of external nip rollers to vacuum on an opposite side of the housing, wherein the first sealing surfaces, the pair of external nip rollers, the second sealing surfaces, and the pair of wiper seals separate atmospheric pressure outside of the housing from a first sub-atmospheric internal pressure in an internal volume of the housing which has a set of boundary surfaces that includes surfaces of the pair of external nip rollers;

at least one conductance limiter configured to pass the web substrate between two parallel plates, wherein each of the two parallel plates is adjoined to a surface of the housing to which one of the pair of wiper seals is mounted, an input spool located outside of the housing; and a welding apparatus located between the input spool and the pair of external nip rollers and configured to weld a trailing edge of the web substrate from a first roll being removed from the input spool to a leading edge of the web substrate from a second roll being mounted on the input spool.

2. The apparatus of claim 1, further comprising at least one reverse crown roller located in at least one of the multiple chambers and an inert gas purge mechanism located at the pair of external nip rollers.

3. The apparatus mechanism of claim 1, wherein the vacuum sealing mechanism is configured to pass the web substrate without deformation of the web substrate.

4. The apparatus of claim 1, wherein the apparatus has only one input spool located only in a non-vacuum input module.

5. The apparatus of claim 4, further comprising an accumulator that is configured to continuously provide the web substrate from the welding apparatus into the at least one process module without stopping the web substrate during welding of the trailing edge of the web substrate from the first roll which is removed from the input spool to the leading edge of the web substrate from the second roll which is mounted on the input spool.

6. The apparatus of claim 5, wherein the accumulator comprises a first set of rollers and a second set of rollers which are interspaced with the first set of rollers, and the second set of rollers are movable with respect to the first set of rollers such that a path of the web substrate through the accumulator is made longer or shorter.

7. The apparatus of claim 6, wherein the welding apparatus comprises a welding head which is configured to move over a metal electrically grounded table.

8. The apparatus of claim 1, further comprising at least one pair of internal nip rollers located in at least one of the multiple chambers.

9. The apparatus of claim 1, wherein the set of boundary surfaces of the internal volume of the housing further includes surfaces of the pair of wiper seals and a subset of surfaces of the housing between the pair of wiper seals and an opening within the housing through which the web substrate moves into the multiple chambers of the housing.

10. The apparatus of claim 1, further comprising an accumulator located between the welding apparatus and the pair of external nip rollers.

11. The apparatus of claim 1, wherein the multiple chambers comprise:
   at least one pair of internal nip rollers located between a first adjacent pair among the multiple chambers; and
   at least one pair of parallel plate conductance limiters located between a second adjacent pair among the multiple chambers.

12. The apparatus of claim 1, further comprising at least one process chamber configured to receive a portion of the web substrate that passes through the multiple chambers.

13. The apparatus of claim 1, wherein the multiple chambers of the housing are configured such that all atmosphere evacuated from the housing is removed through a last chamber of the housing positioned at an opposite end of the pair of external nip rollers into a first process chamber among the at least one process chamber.

\* \* \* \* \*